United States Patent
Kloeppel et al.

(10) Patent No.: US 7,550,890 B2
(45) Date of Patent: Jun. 23, 2009

(54) MOTOR ASSEMBLY WITH AN INTEGRATED FLEXIBLE PRINTED CIRCUIT

(75) Inventors: Klaus Dieter Kloeppel, Watsonville, CA (US); Anthony Joseph Aiello, Santa Cruz, CA (US); Paco Flores, Felton, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 514 days.

(21) Appl. No.: 11/209,438

(22) Filed: Aug. 23, 2005

(65) Prior Publication Data

US 2007/0046127 A1 Mar. 1, 2007

(51) Int. Cl.
*H02K 3/00* (2006.01)
*H02K 19/26* (2006.01)

(52) U.S. Cl. .................. 310/180; 310/208; 310/201; 310/67 R; 310/DIG. 6

(58) Field of Classification Search ............. 310/180, 310/208, 201, 67 R, DIG. 6
See application file for complete search history.

(56) References Cited

U.S. PATENT DOCUMENTS

| | | | | |
|---|---|---|---|---|
| 3,705,335 | A * | 12/1972 | Metzger | 361/293 |
| 4,039,875 | A * | 8/1977 | Morreale | 310/194 |
| 4,923,406 | A | 5/1990 | Bucknam | 439/77 |
| 5,138,209 | A | 8/1992 | Chuta et al. | 310/67 |
| 5,256,922 | A | 10/1993 | Tanaka et al. | 310/71 |
| 5,313,128 | A | 5/1994 | Robinson et al. | 310/71 |
| 5,422,526 | A * | 6/1995 | Kawabata et al. | 310/201 |
| 5,436,517 | A * | 7/1995 | Ogawa | 310/91 |
| 5,493,159 | A | 2/1996 | Norris | 310/71 |
| 5,541,787 | A | 7/1996 | Jabbari et al. | 360/97.01 |
| 5,705,866 | A | 1/1998 | Oguchi | 310/67 |
| 5,875,069 | A * | 2/1999 | Suzuki et al. | 360/99.04 |
| 5,982,061 | A | 11/1999 | Grantz et al. | 310/67 |
| 6,204,996 | B1 | 3/2001 | MacLeod | 360/99.08 |
| 6,236,535 | B1 | 5/2001 | Gilliland et al. | 360/99.08 |
| 6,528,914 | B2 | 3/2003 | Kloeppel et al. | 310/71 |
| 6,548,933 | B2 * | 4/2003 | Yasuhara et al. | 310/203 |
| 6,614,138 | B1 | 9/2003 | Pelstring | 310/67 |
| 6,630,758 | B2 | 10/2003 | Aoki et al. | 310/67 |
| 6,700,282 | B2 * | 3/2004 | Mori et al. | 310/208 |
| 6,728,063 | B1 * | 4/2004 | Gustafson et al. | 360/99.08 |
| 6,815,851 | B2 | 11/2004 | Nishikata et al. | 310/67 |
| 2002/0057031 | A1 * | 5/2002 | Ueda et al. | 310/208 |
| 2003/0038561 | A1 * | 2/2003 | Wauke | 310/216 |
| 2004/0061404 | A1 * | 4/2004 | Fujii et al. | 310/216 |
| 2004/0150286 | A1 * | 8/2004 | Godo et al. | 310/216 |
| 2004/0222712 | A1 * | 11/2004 | Hong et al. | 310/67 R |
| 2005/0108870 | A1 * | 5/2005 | Harada et al. | 29/606 |

* cited by examiner

*Primary Examiner*—Quyen P Leung
*Assistant Examiner*—Alex W Mok
(74) *Attorney, Agent, or Firm*—Leanne Taveggia Farrell; Westman, Champlin & Kelly, P.A.

(57) ABSTRACT

The present invention provides a motor assembly for mounting to a base. The motor assembly includes a stator assembly having a plurality of stator teeth. Each stator tooth is configured to support a stator coil. The motor assembly also includes a flexible printed circuit having top and bottom surfaces and an end portion. The end portion is affixed to the stator assembly at the top surface. The bottom surface is affixed to the base.

22 Claims, 8 Drawing Sheets

MOTOR ASSEMBLY WITH AN INTEGRATED FLEXIBLE PRINTED CIRCUIT

FIELD OF THE INVENTION

The present invention relates generally to data storage systems. In particular, but not by limitation, the present invention relates to a motor assembly for a data storage system.

BACKGROUND OF THE INVENTION

A typical data storage system includes a rigid housing having a basedeck and top cover that encloses a variety of components. The components include one or more discs having data surfaces that are coated with a magnetizable medium for storage of digital information in a plurality of circular, concentric data tracks. The discs are mounted on a spindle motor. In general, spindle motors are mounted and secured to a base of a disc drive with screws and corresponding threaded holes using a bracket mounting. The spindle motor causes the discs to spin and the data surfaces of the discs to pass under respective aerodynamic bearing disc head sliders. The sliders carry transducers, which write information to and read information from the data surfaces of the discs.

Recently, there has been a rapid increase in the production of smaller and lighter weight drives in the disc drive industry. The demand to reduce the physical size of disc drives has caused the diameter of the discs in the disc drive to decrease as well as a decrease in the amount of discs in the disc drive. As disc dimension becomes smaller and the amount of discs in the disc drive are reduced, so has the relative height of the disc drive become smaller. Therefore, a spindle motor that causes the discs to spin can only occupy a space that conforms to certain predetermined height requirements.

The use of screws and a mounting bracket are no longer a viable way of mounting a spindle motor to a base of a disc drive. The use of screws and a mounting bracket require more height than is allowed by the height constraints of the enclosure of a small form factor disc drive. In addition, methods of mounting a spindle motor to a base of a small form factor drive are difficult and costly. In particular, component part handling and component alignment have become increasingly difficult because of the space constraints.

Embodiments of the present invention provide solutions to these and other problems, and offer other advantages over the prior art.

SUMMARY OF THE INVENTION

The present invention provides a motor assembly for mounting to a base. The motor assembly includes a stator assembly having a plurality of stator teeth. Each stator tooth is configured to support a stator coil. The motor assembly also includes a flexible printed circuit having top and bottom surfaces and an end portion. The end portion is affixed to the stator assembly at the top surface. The bottom surface is affixed to the base.

The present invention also provides a method of assembling a motor to a base. The method includes providing a stator assembly having a plurality of stator teeth configured to support a stator coil and providing a flexible printed circuit having top and bottom surfaces and an end portion. The method further includes affixing the end portion to the stator assembly on the top surface of the flexible printed circuit. The bottom surface of the flexible printed circuit is affixed to the base.

The present invention also provides a motor assembly. The motor assembly includes a flexible printed circuit having a first surface and a stator assembly deposited on the first surface of the flexible printed circuit. The stator assembly includes a stator yoke and a plurality of stator teeth that extend from the stator yoke. Each stator tooth has a top portion and side portions. The motor assembly also includes a set of staple-shaped stator conductors deposited on the top portion of each stator tooth such that each of the sets of staple-shaped conductors are adjacent the top portion and the side portions of each stator tooth. Furthermore, the motor assembly includes a plurality of patterns of conductor traces included in the flexible printed circuit. Each pattern of conductor traces is configured to electrically couple to the set of staple-shaped stator conductors that are deposited on each stator tooth to form a stator coil.

Other features and benefits that characterize embodiments of the present invention will be apparent upon reading the following detailed description and review of the associated drawings.

DETAILED DESCRIPTION OF ILLUSTRATIVE EMBODIMENTS

Figure 1:
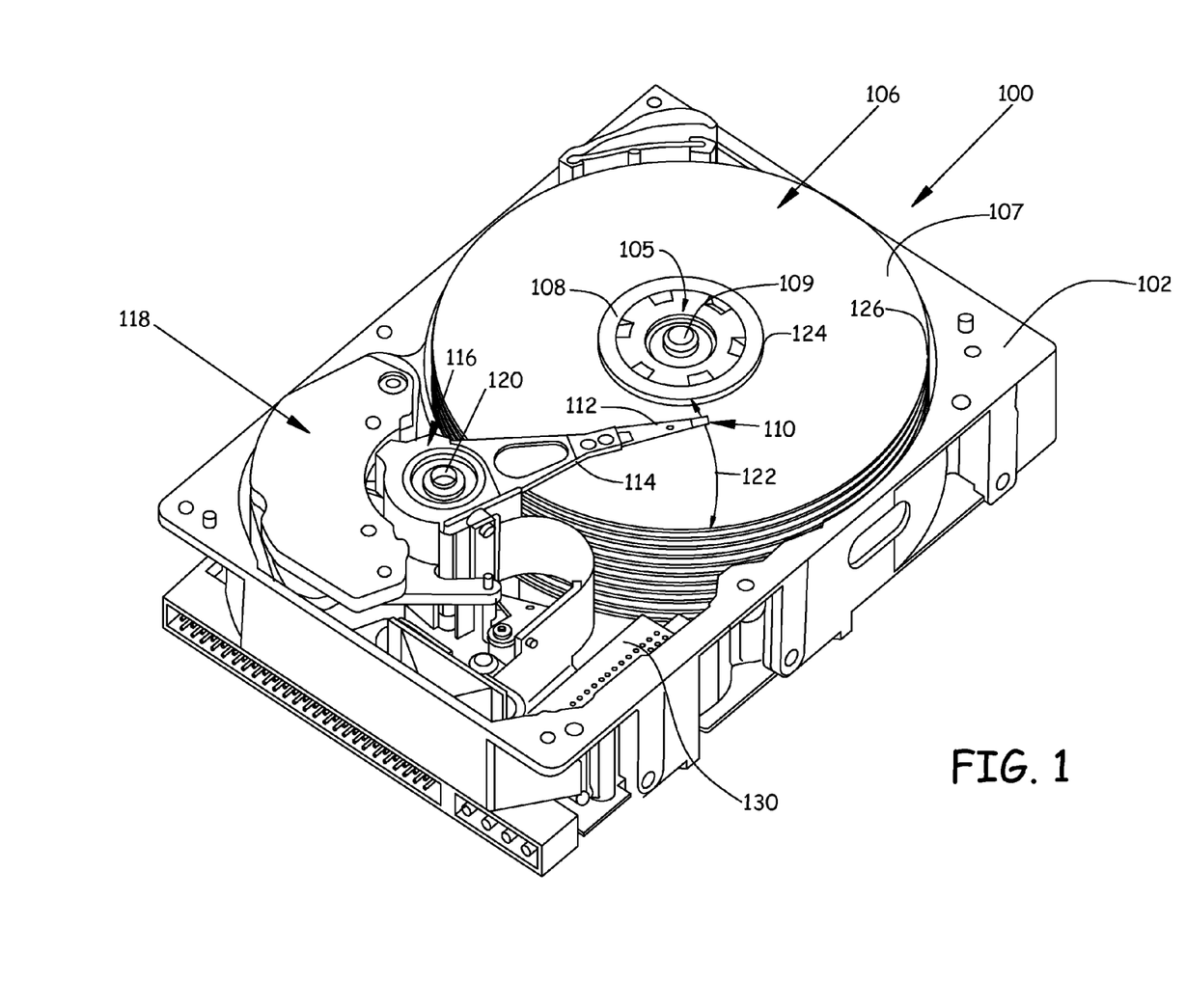
FIG. 1 illustrates a top perspective view of a data storage system.

FIG. 1 is a top perspective view of data storage system 100 in which embodiments of the present invention are useful. Disc drives are common data storage systems. Disc drive 100 includes a basedeck 102 and a top cover (not shown). Disc drive 100 further includes a storage medium 106, which is mounted on a spindle motor 105 by a clamp 108. As illustrated in FIG. 1, storage medium 106 includes a plurality of individual discs 107, which are mounted for co-rotation about central axis 109. However, disc drive 100 can also include a single disc that is mounted to spindle motor 105 by clamp 108 or other types of clampless devices. Each disc surface has an associated slider 110, which carries a read/write head for communication with the surface of the disc.

Each slider 110 is supported by a suspension 112 which is in turn attached to a track accessing arm 114 of an actuator mechanism 116. Actuator mechanism 116 is rotated about a shaft 120 by a voice coil motor 118, which is controlled by servo control circuitry within internal circuit 130. As voice coil motor 118 rotates actuator mechanism 116, slider 110 moves in an arcuate path 122 between a disc inner diameter 124 and a disc outer diameter 126. The present invention provides embodiments for mounting a spindle motor to a small form factor disc drive efficiently and cost effectively.

Recently, there is an increasing demand to design smaller and lighter disc drives. Small form factor drives have restricted height limitations. A spindle motor can only occupy a predetermined height. It is also increasingly difficult and costly to mount a spindle motor to a small form factor disc drive because of these size constraints.

Figure 2:
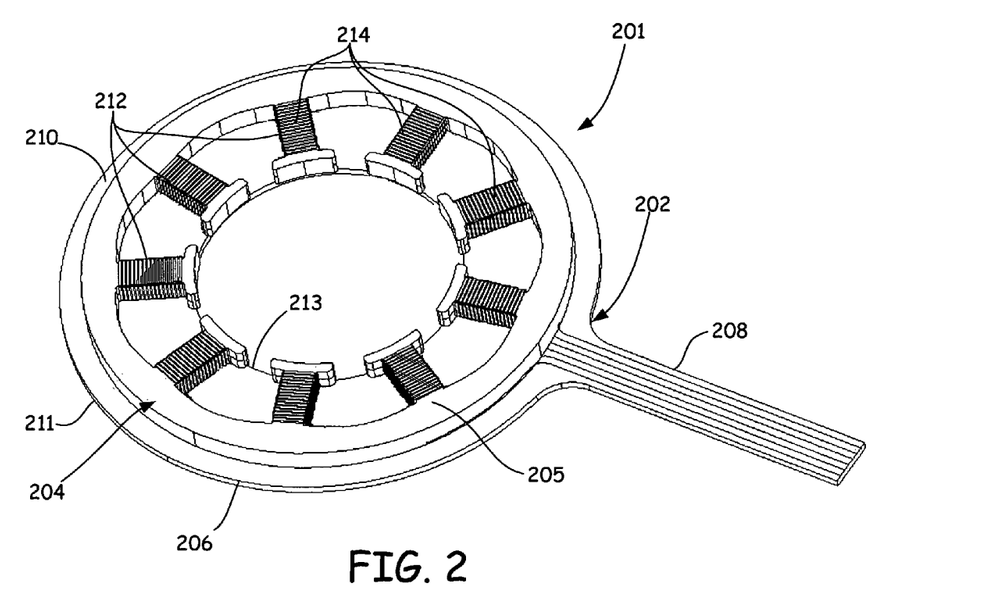
FIG. 2 illustrates a top perspective view of a motor subassembly in accordance with an embodiment of the present invention.

FIG. 2 illustrates a top perspective view of a motor subassembly 201 in accordance with an embodiment of the present invention. Motor subassembly 201 includes a flexible printed circuit (FPC) 202 and a stator assembly 204. FPC 202 has a top surface 210 and a bottom surface (hidden from view). FPC 202 includes an end portion 206 and a pathway portion 208. End portion 206 accommodates stator assembly 204. Pathway portion 208 provides a pathway for an interconnect layer, integrally formed in FPC 202, to couple stator assembly 204 to a remotely located electrical connector for ultimate coupling to a printed circuit board (PCB). The interconnect layer will be discussed in detail with reference to FIG. 3.

Stator assembly 204 includes an annular stator yoke 205 integrally formed with a plurality of symmetrically and radially arranged stator teeth 212. Each stator tooth 212 is configured to support a stator coil 214. As illustrated in FIG. 2 and in one embodiment, end portion 206 of FPC 202 has an annular top surface area such that the end portion includes an outer diameter 211 and an inner diameter 213. In one embodiment, end portion 206 is affixed with an adhesive to stator assembly 204 at top surface 210 between inner diameter 213 and outer diameter 211. However, end portion 206 can be affixed to stator assembly 204 with other materials. For example, end portion 206 can be affixed to stator assembly 204 with solder.

Figure 3:
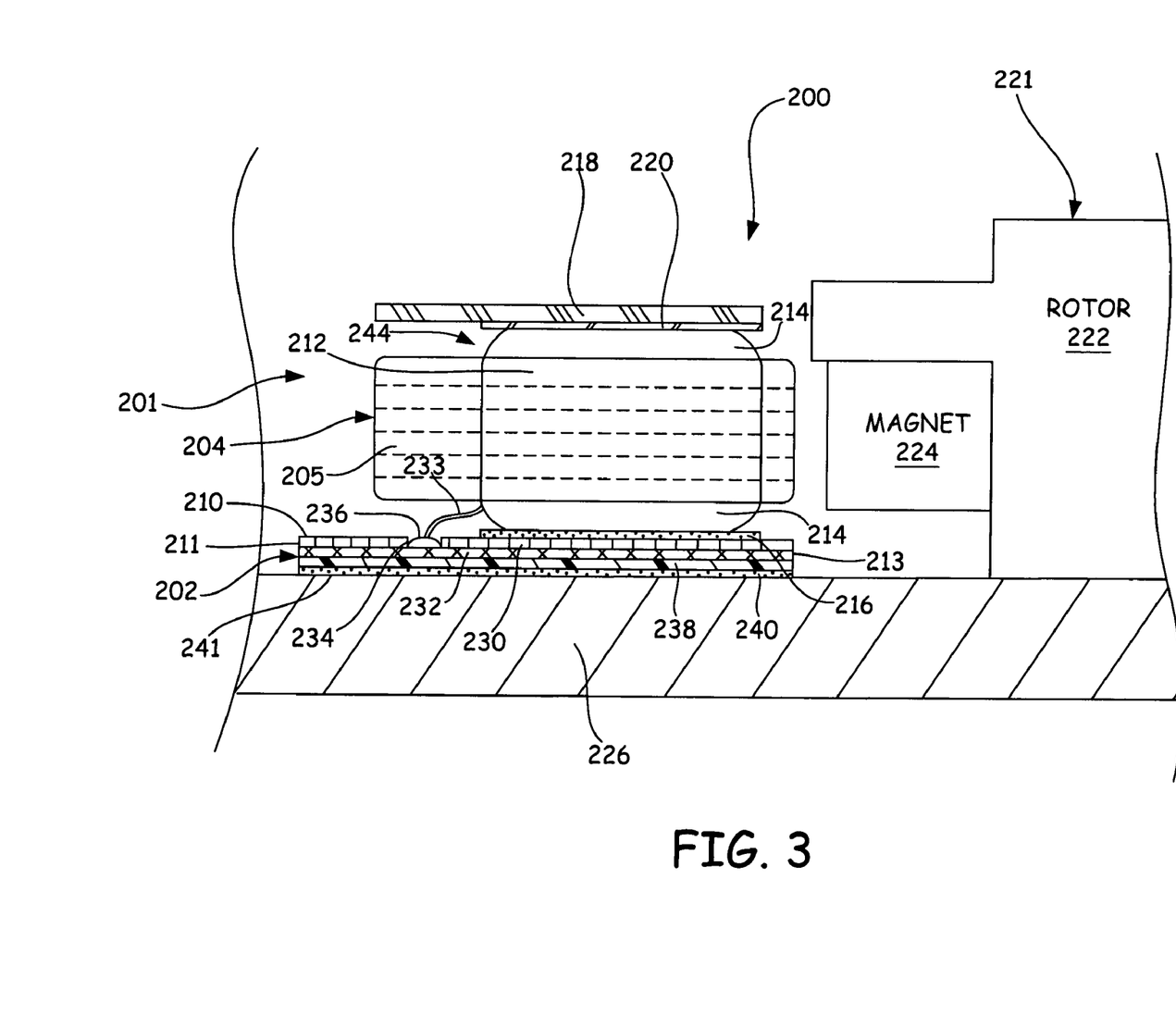
FIG. 3 illustrates a partial sectional view of a motor assembly including the motor subassembly illustrated in FIG. 2 in accordance with an embodiment of the present invention.

FIG. 3 illustrates a partial sectional view of a motor assembly 200 including the motor subassembly 201 illustrated in FIG. 2 in accordance with an embodiment of the present invention. As illustrated in the FIG. 3 embodiment, FPC 202 is adhered to stator assembly 204 with an adhesive 216. However, as previously discussed, FPC 202 can be affixed to stator assembly 204 with other materials. In addition, FPC 202 can be affixed to spacers, which then adhere to stator assembly 204. Such spacers are located near inner diameter 213 and/or located near outer diameter 211 of FPC 202 and can be made of an insulating material.

Stator assembly 204 includes stator yoke 205, stator tooth 212 and stator coil 214. As illustrated in FIG. 3, stator assembly 204 is formed in a layered stack of magnetic steel laminations that are wound with wire. The layered stack of steel is coated with an insulative coating prior to winding. In addition, FIG. 3 also illustrates a base 226 in which FPC 202 is affixed to. In one embodiment of the present invention, base 226 is a basedeck of a data storage system. However, those skilled in the art should recognize that the present invention can be incorporated in other types of systems.

Motor assembly 200 also includes a simplified illustration of a rotor assembly 221. Rotor assembly 221 includes a rotor 222 and an annular magnet 224. Rotor assembly 221 is centrally located and mounted on base 226 such that stator assembly 204 and the inner diameter 213 of end portion 206 are spaced apart from and positioned around rotor assembly 221. In operation, stator coils 214 generate a magnetic flux that interacts with annular magnet 224 to thereby operably rotate rotor 222. Rotor 222 includes details not specifically depicted in FIG. 3, such as a bearing in between rotating and stationary assemblies. Rotor 222 also includes mounting provisions on the rotating assembly to support a load, such as a disc in a data storage system.

Motor assembly 200 also includes a flux shield 218 and an insulating layer 220. In one embodiment, flux shield 218 and insulating layer 220 are affixed to a top portion 244 of stator coil 214 with an adhesive. In a data storage system, flux shield 218 and insulating layer 220 assist in insulating discs or media from magnetic fields created by stator assembly 204 and magnet 224. Flux shield 218 and insulating layer 220 are adhered to stator coil 214 which creates a "sandwich" potting of stator coils to thereby mute acoustic output. Those skilled in the art should recognize that other embodiments of the present invention can include a motor assembly without a flux shield.

As illustrated in detail in FIG. 3, FPC 202 includes a plurality of layers. FPC 202 includes a cover layer 230 formed of plastic. However, it should be noted that other types of materials can be used. As discussed above, FPC 202 also includes an interconnect layer 232 adjacent cover layer 230. Interconnect layer 232 includes a plurality of layers of traces or a single trace layer for routing all phases of the motor, such as metallic traces in one embodiment, or, for added stiffness and/or lower resistance in another embodiment, heavy gage copper traces. Cover layer 230 provides a plurality of openings, such as opening 234, for exposing and allowing the traces of interconnect layer 232 to electrically couple to wire leads 233 of stator coil 214. Although not specifically illustrated in FIG. 3, in one embodiment, interconnect layer 232 includes layers of traces for each phase of the motor assembly with insulating layers in between. For example, in a three-phase motor, a stator assembly may have nine stator teeth each supporting a stator coil. Other numbers of motor phases and stator teeth are possible and are known by those skilled in the art. A first layer of traces in the interconnect layer are coupled to three stator coils that are evenly spaced from each other. A second layer of traces in the interconnect layer are coupled to three different stator coils that are evenly spaced from each other. Still further, a third layer of traces in the interconnect layer are coupled to the three remaining stator coils that are evenly spaced from each other.

Stator coil 214 is electrically coupled to one of the layers of traces of interconnect layer 232 with a solder joint 236. Such solder connections minimize wire routing. The layers of traces included in interconnect layer 232 electrically couple each stator coil 214 supported by each stator tooth 212 to a remotely located electrical connector through pathway portion 208 (FIG. 2) and ultimately to a printed circuit board (PCB) such that stator coils 214 can generate magnetic fields.

FPC 202 also includes a stiffener layer 238. Stiffener layer 238 is adjacent interconnect layer 232 and located on an opposing side of the interconnect layer from cover layer 230. Stiffener layer 238 is made of an insulating material that imparts rigidity in FPC 202. For example, stiffener layer 238 can be a metallic layer such as aluminum separated from interconnect layer 232 by an additional insulating layer or a non-metallic layer such as polyimide materials. Those skilled in the art should recognize that other types of materials having similar properties can be used.

Motor assembly 200 is configured for attachment to base 226. In one embodiment of the present invention, FPC 202 includes an adhesive layer 240. Adhesive layer 240 allows flux shield 218, stator coil 214, stator teeth 212 and FPC 202 to be affixed to base 226. In such an embodiment, adhesive layer 240, such as a layer of pressure sensitive adhesive (PSA), also includes a liner and is formed adjacent stiffener layer 238 on a bottom surface 241 of FPC 202. In use, the liner is peeled back and removed to expose the adhesive for attachment. However, motor assembly 200 can be affixed to base 226 in other manners. For example, adhesive layer 240 can be replaced with a separately applied adhesive or epoxy.

Therefore, FPC 202 is used as a positioning and attachment basis onto which stator assembly 204 can be installed into a data storage system quickly and inexpensively. During manufacture and before being affixed to base 226, motor assembly 200 is radially aligned through fixturing and tacked or partially cured using the adhesives described above. For example, the adhesive used to affix flux shield 218 and insulating layer 220 to stator assembly 204 and the adhesive used to affix the stator assembly to top surface 210 of FPC 202 are partially cured. After tacking, motor assembly 200 can be fully cured in an oven.

Figure 4:
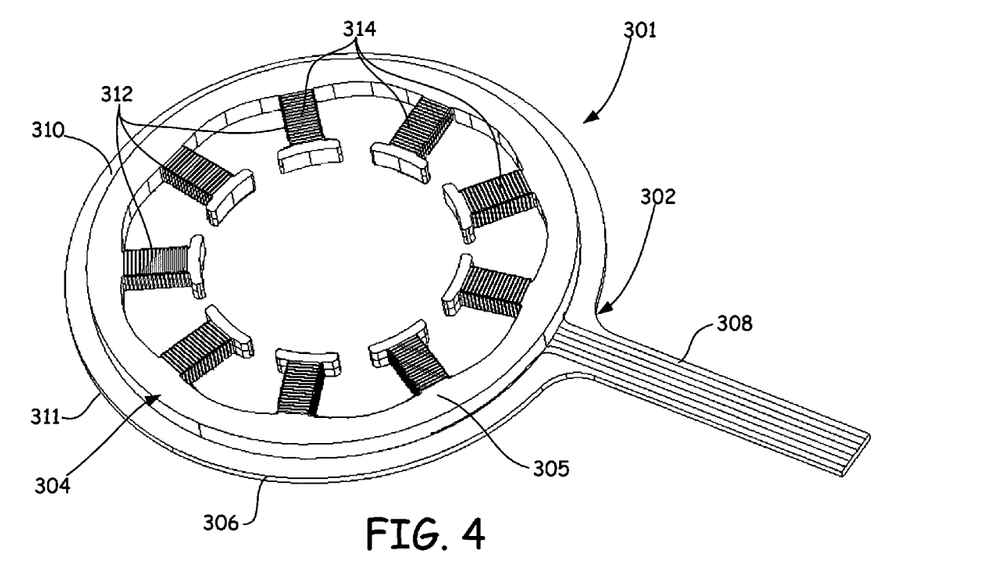
FIG. 4 illustrates a top perspective view of a motor subassembly in accordance with an embodiment of the present invention.

FIG. 4 illustrates a top perspective view of a motor subassembly 301 in accordance with an embodiment of the present invention. Motor subassembly 301 includes a FPC 302 and a stator assembly 304. FPC 302 has a top surface 310 and a bottom surface (hidden from view). FPC 302 includes an end portion 306 and a pathway portion 308. End portion 306 accommodates stator assembly 304. Pathway portion 308 provides a pathway for an interconnect layer, integrally formed with FPC 302, to couple stator assembly 304 to a remotely located electrical connector for ultimate coupling to a PCB. The interconnect layer will be discussed in detail with reference to FIG. 5.

Stator assembly 304 includes an annular stator yoke 305 integrally formed with a plurality of symmetrically and radially arranged stator teeth 312. Each stator tooth 312 is configured to support a stator coil 314. In comparison to the embodiment illustrated in FIG. 2, the embodiment illustrated in FIG. 4 includes an end portion 306 having a circular top surface area such that the end portion includes an outer diameter 311. Unlike FPC 202 of FIG. 2, FPC 302 does not include an inner opening. In one embodiment, end portion 306 is affixed with an adhesive to stator assembly 304 at top surface 310. However, end portion 306 can be affixed to stator assembly 304 with other materials. For example, and as discussed in FIG. 2, end portion 306 can be affixed to spacers which are adhered to stator assembly 304. End portion 306 can also be affixed to stator assembly 304 with solder.

Figure 5:
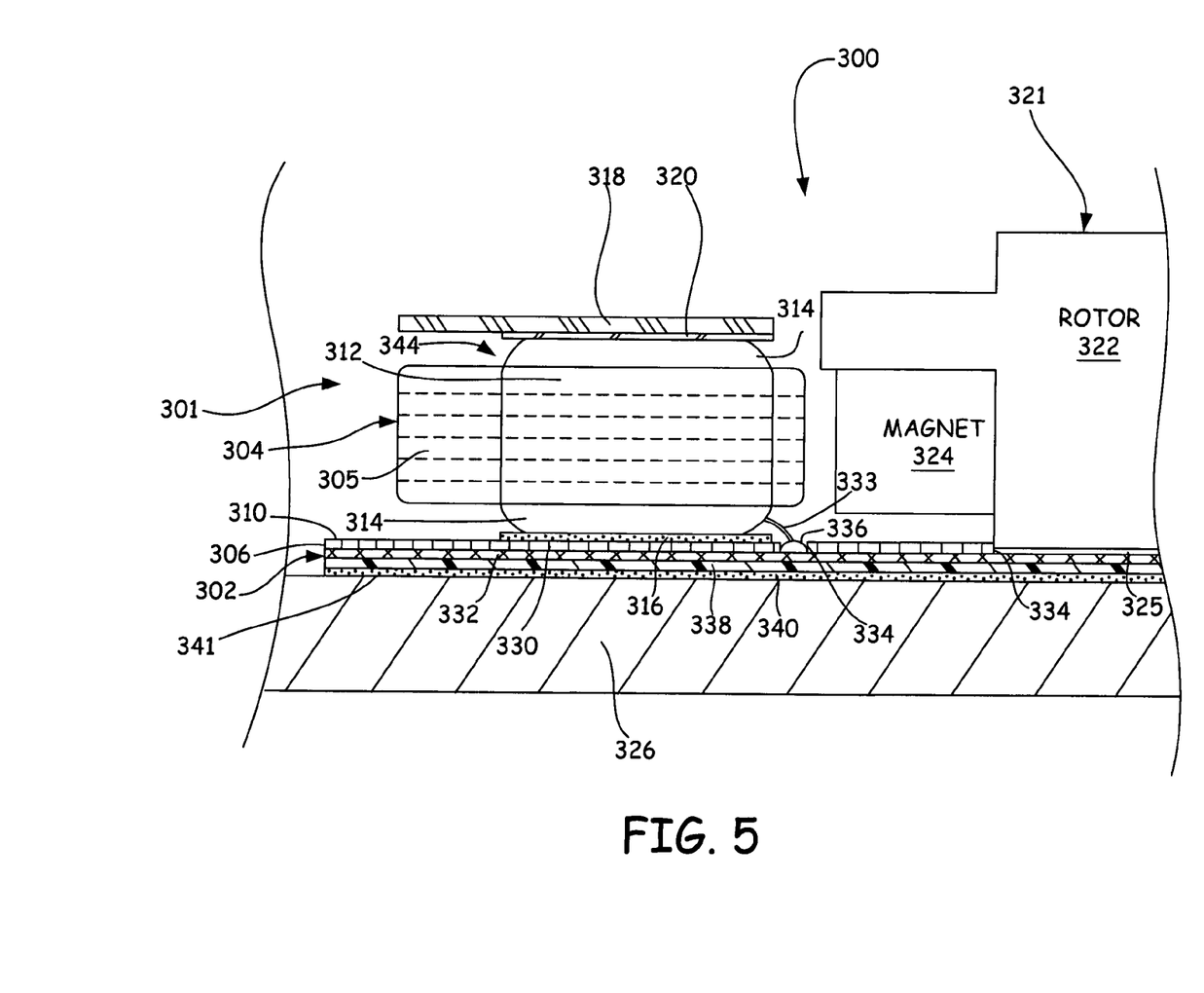
FIG. 5 illustrates a partial sectional view of a motor assembly including the motor subassembly illustrated in FIG. 4 in accordance with an embodiment of the present invention.

FIG. 5 illustrates a partial sectional view of a motor assembly 300 including the motor subassembly 301 illustrated in FIG. 4 in accordance with an embodiment of the present invention. As illustrated in the FIG. 5 embodiment, FPC 302 is adhered to stator assembly 304 with an adhesive 316. However, as previously discussed, FPC 302 can be affixed to stator assembly 304 with other materials.

Stator assembly 304 includes stator yoke 305, stator tooth 312 and stator coil 314. As illustrated in FIG. 5, stator assembly 304 is formed in a layered stack of magnetic steel laminations that are wound with wire. The layered stack of steel is coated with an insulative coating prior to winding. In addition, FIG. 5 also illustrates a base 326 in which FPC 302 is affixed to. In one embodiment of the present invention, base 326 is a basedeck of a data storage system. However, those skilled in the art should recognize that the present invention can be incorporated in other types of systems.

Motor assembly 300 also includes a simplified illustration of a rotor assembly 321. Rotor assembly 321 includes a rotor 322 and an annular magnet 324. Rotor assembly 321 is centrally located and mounted on FPC 302 such that stator assembly 304 is spaced apart and positioned around rotor assembly 321 on end portion 306.

Motor assembly 300 also includes a flux shield 318 and an insulating layer 320. In one embodiment, flux shield 318 and insulating layer 320 are affixed to a top portion 344 of stator coil 314 with an adhesive. As discussed above, flux shield 318 and insulating layer 320 assist in insulating discs or media in a data storage system from magnetic fields created by stator assembly 304 and magnet 324. Flux shield 318 and insulating layer 320 are adhered to stator tooth 304 which creates a "sandwich" potting of stator conductors to thereby mute acoustic output. Those skilled in the art should recognize that other embodiments of the present invention can include a motor assembly without a flux shield.

As illustrated in detail in FIG. 5, FPC 302 includes a plurality of layers. FPC 302 includes cover layer 330 that forms top surface 310 and includes a plurality of openings 334 for exposing and allowing interconnect layer 332, adjacent the cover layer, to electrically connect to lead wires 333 of stator coil 314 with a solder joint 336 and to couple to rotor 322. Besides interconnect layer 332 including traces for each phase of motor assembly 300, interconnect layer 332 can also include at least one trace for coupling to rotor 322. Interconnect layer 332 can also include a ground trace. In one embodiment, rotor 322 is affixed to end portion 306 of FPC 302 with solder 325 such that rotor 322 can be electrically coupled and electrically grounded to interconnect layer 332 of FPC 302. However, those skilled in the art should recognize that other configurations are possible. For example, rotor 322 can be affixed to end portion 306 and electrically coupled to interconnect layer 332 with an electrically conductive adhesive. FPC 302 also includes a stiffener layer 338 adjacent interconnect layer 332 as discussed in the description related to FIG. 3.

Motor assembly 300 includes an adhesive layer 340 that allows flux shield 318, stator coil 314, stator tooth 312 and FPC 302 to be affixed to base 326. In such an embodiment, adhesive layer 340, such as a layer of PSA, also includes a liner and is formed adjacent stiffener layer 338 on a bottom surface 341 of FPC 302. In use, the liner is peeled back and removed to expose the adhesive for attachment. However, motor assembly 300 can be affixed to base 326 in other manners. For example, adhesive layer 340 can be replaced with a separately applied adhesive or epoxy.

Therefore, FPC 302 is used as a positioning and attachment basis onto which stator assembly 304 and rotor assembly 321 can be installed into a data storage system quickly and inexpensively. As discussed with reference to FIG. 3, motor assembly 300, before being affixed to base 326, can also be radially aligned through fixturing and tacked or partially cured using the adhesives described above. After tacking, motor assembly 300 can be fully cured in an oven.

Figure 6:
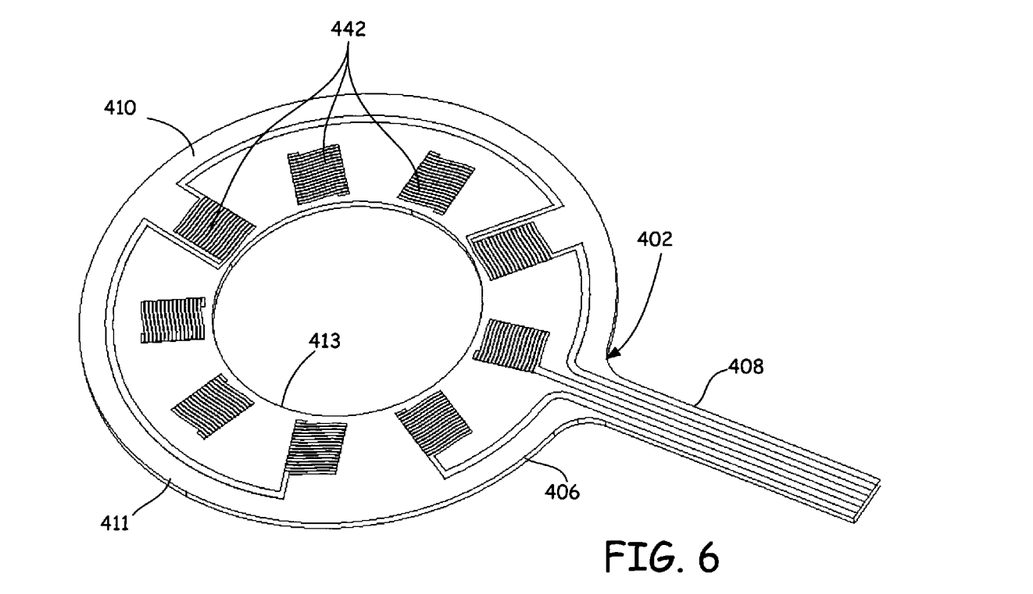
FIG. 6 illustrates a top perspective view of a flexible printed circuit in accordance with an embodiment of the present invention.

FIG. 6 illustrates a top perspective view of a FPC 402 in accordance with an embodiment of the present invention. FPC 402 has a top surface 410 and a bottom surface (hidden from view). FPC 402 includes an end portion 406 and a pathway portion 408. End portion 406 accommodates stator assembly 404. Pathway portion 408 provides a pathway for an interconnect layer, integrally formed with FPC 402, to couple stator assembly 404 to a remotely located electrical connector through pathway portion 408 for ultimate coupling to a PCB. In one embodiment, FIG. 6 illustrates end portion 406 of FPC 402 as having an annular top surface area such that the end portion includes an outer diameter 411 and an inner diameter 413. End portion 406 of FPC 402 includes a plurality of patterns of conductor traces 442. Each pattern of conductor traces 442 are symmetrically and radially arranged on top surface 410 of end portion 406 between outer diameter 411 and inner diameter 413. Portions of the pattern of conductor traces 442 are exposed to top surface 410. These exposed openings are not shown in FIG. 6 because, as illustrated, a cover layer that forms top surface 410 of FPC 402 is transparent. Conductor traces 442 are included in the interconnect layer of FPC 402. However, the illustrated conductor traces 442 show only a single layer of conductor traces. Below the illustrated layer of conductor traces are other layers of conductor traces configured for use in connecting other types of motors having different numbers of phases. The interconnect layer will be discussed in detail with reference to FIG. 11.

Figure 7:
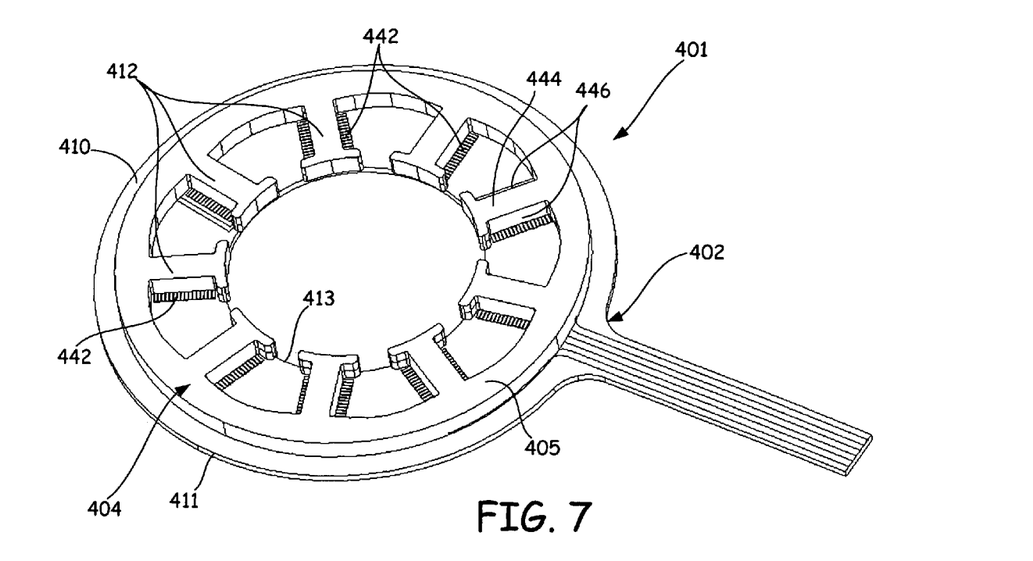
FIG. 7 illustrates a top perspective view of a portion of a motor subassembly including the flexible printed circuit illustrated in FIG. 6 in accordance with an embodiment of the present invention.

FIG. 7 illustrates a top perspective view of a portion of a motor subassembly 401 including the FPC 402 of FIG. 6 in accordance with an embodiment of the present invention. Stator assembly 404 includes an annular stator yoke 405 coupled to a plurality of symmetrically and radially arranged stator teeth 412. Each stator tooth 412 includes a top portion 444 and side portions 446. Each stator tooth 412 is positioned adjacent and in alignment with each pattern of conductor traces 442. End portion 406 is affixed to stator assembly 404 at top surface 410 and between inner diameter 413 and outer diameter 411. In one embodiment, end portion 406 is affixed to stator assembly 404 with solder. However, end portion 406 can be affixed to stator assembly 404 with other materials, such as adhesive.

Figure 8:
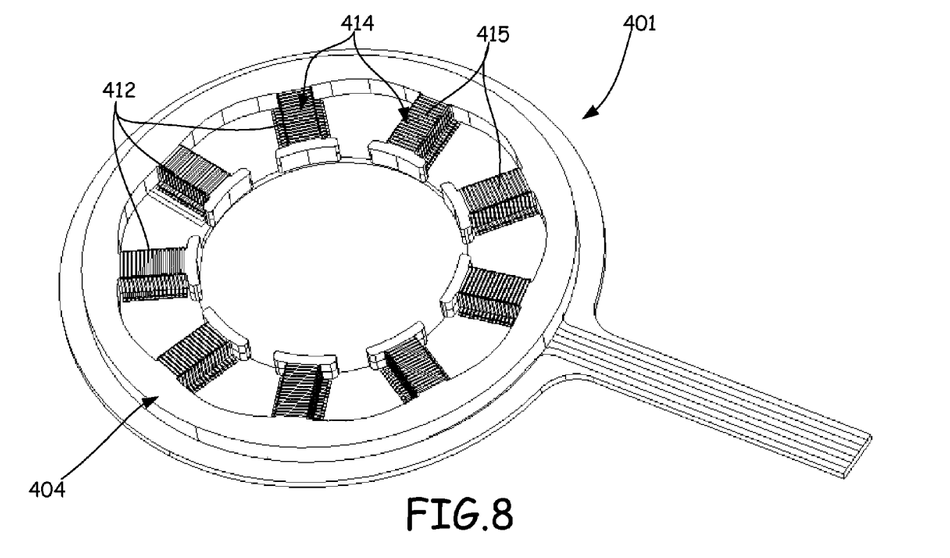
FIG. 8 illustrates a top perspective view of a motor subassembly that is illustrated partially in FIG. 7 in accordance with an embodiment of the present invention.

FIG. 8 illustrates a top perspective view of motor subassembly 401 illustrated partially in FIG. 7 in accordance with an embodiment of the present invention. Each stator tooth 412 of stator assembly 404 is configured to support a stator coil 414. In the embodiment illustrated in FIG. 8, each stator coil 414 includes a set of staple-shaped stator conductors 415. Each set of staple-shaped stator conductors 415 are deposited on top portion 444 (FIG. 7) of each stator tooth 412 such that each set of the staple-shaped stator conductors are adjacent the top portion and adjacent side portions 446 (FIG. 7) of each stator tooth. Each set of staple-shaped stator conductors 415 has a shape similar to a shape of a conventional staple which is more clearly illustrated with respect to FIGS. 9 and 10.

Figure 9:
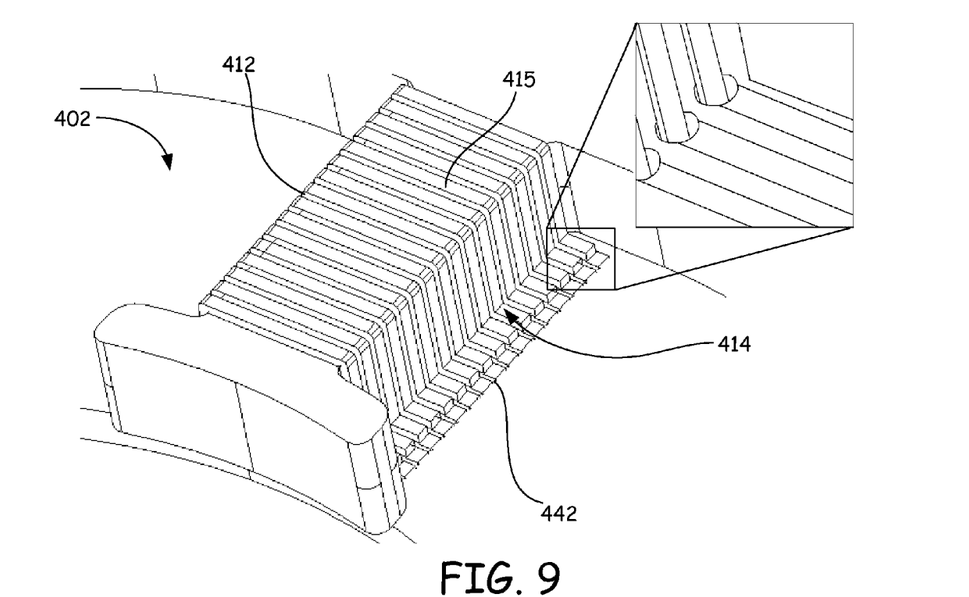
FIG. 9 illustrates an enlarged perspective view of one of the stator teeth illustrated in FIG. 8 in accordance with an embodiment of the present invention.
Figure 10:
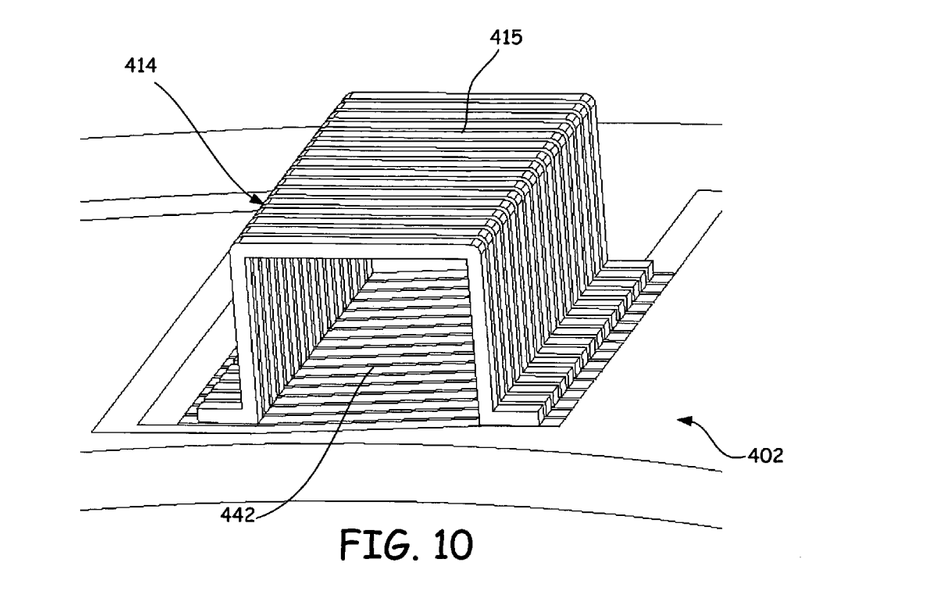
FIG. 10 illustrates an enlarged perspective view of the stator coil illustrated in FIG. 9 in accordance with an embodiment of the present invention.

FIG. 9 illustrates an enlarged perspective view of a stator tooth 412 having a stator coil 414. FIG. 10 illustrates an enlarged perspective view of stator coil 414 shown in FIG. 11, but with the stator tooth removed for purposes of clarity. As illustrated in FIGS. 9 and 10, each set of staple-shaped stator conductors 415 are electrically and mechanically coupled, using solder, to a corresponding pattern of conductor traces 442 to thereby form stator coil 414. Stator coils 414 electrically perform similar to the stator coils (214, 314) illustrated in FIGS. 2 and 4. However, stator coils 414 are formed of two components. One of the components is the pattern of conductor traces 442 and the other component is the set of stator conductors 415. Upon energization, the electrically coupled set of stator conductors 415 and the pattern of conductor traces 442, illustrated in FIGS. 9 and 10, generate a magnetic field. It should be noted that each staple-shaped stator conductor 415 can be in contact with each other if coated with a thin insulating material. Otherwise, each staple-shaped stator conductor is spaced a distance from each other to avoid electrical shorting.

As illustrated in FIG. 9, FPC 402 is affixed to stator assembly 404 with solder by way of staple-shaped conductors 415 being stacked on stator teeth 412 and soldered to conductor traces 442. In another embodiment and as illustrated in the magnified box in FIG. 9, staple-shaped stator conductors 415 can have a pair of prongs on their tips instead of a pair of feet as otherwise illustrated in FIGS. 9 and 10. In such an embodiment, the pair of prongs are inserted through openings in the top surface and the interconnect layer of FPC 402. The interconnect layer is configured to receive the pair of prongs like a connector receiver. In yet another embodiment, a separate electrical connector can be soldered to the interconnect layer of FPC 402 such that it connects the staple-shaped conductors 415 with conductor traces 442 of the interconnect layer. However, as previously discussed, FPC 402 can also be affixed to stator assembly 404 with other materials, such as adhesive.

Figure 11:
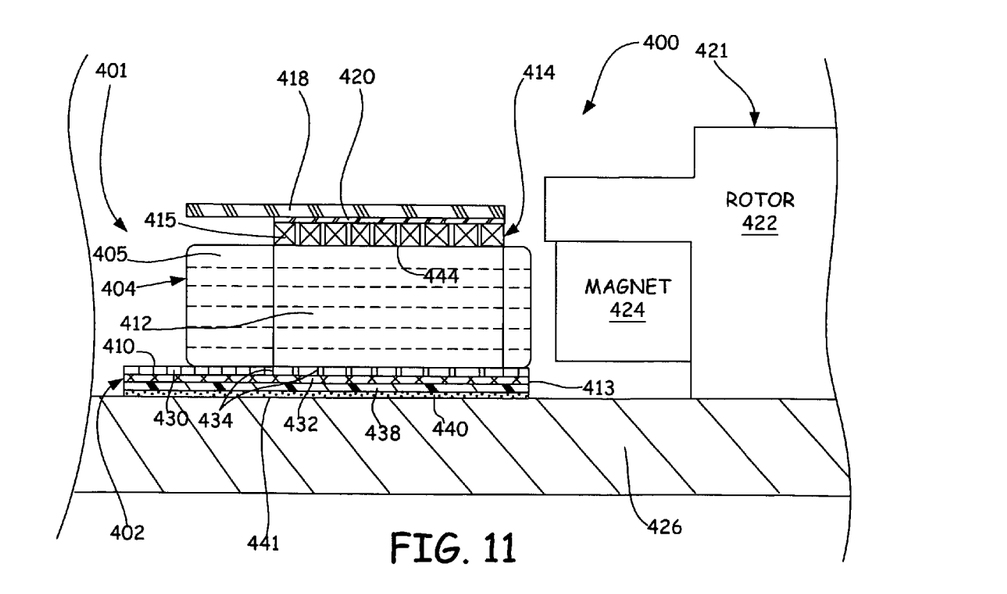
FIG. 11 illustrates a partial sectional view of a motor assembly including the motor subassembly illustrated in FIG. 8 in accordance with an embodiment of the present invention.

FIG. 11 illustrates a partial sectional view of a motor assembly 400 including the motor subassembly 401 illustrated in FIG. 8 in accordance with an embodiment of the present invention. Stator assembly 404 includes stator yoke 405, stator tooth 412 and stator coil 414. Stator coil 414 includes the pattern of conductor traces (not specifically illustrated in FIG. 11) included in interconnect layer 432 of FPC 402 and a set of staple-shaped stator conductors 415. Stator assembly 404 is formed of a layered stack of magnetic steel laminations that are wound with wire. The layered stack of steel is coated with an insulative coating prior to winding. In addition, FIG. 11 also illustrates a base 426 in which FPC 402 is affixed to. In one embodiment of the present invention, base 426 is a basedeck of a data storage system. However, those skilled in the art should recognize that the present invention can be incorporated in other types of systems.

Motor assembly 400 also includes a simplified illustration of rotor assembly 421. Rotor assembly 421 includes a rotor 422 and an annular magnet 424. Rotor assembly 421 is centrally located and deposited on base 426 such that stator assembly 404 and the inner diameter 413 of end portion 406 are spaced apart from and positioned around rotor assembly 421.

Motor assembly 400 also includes a flux shield 418 and insulating layer 420. In one embodiment, flux shield 418 and insulating layer 420 are affixed to the stapled-shaped stator conductors 415 and top portion 444 of stator coil 414 with an adhesive.

In a data storage system, flux shield 418 and insulating layer 420 assists in insulating the discs or media from magnetic fields created by stator assembly 404 and magnet 424. Flux shield 418 and insulating layer 420 are adhered to stator tooth 412 which creates a "sandwich" potting of stator conductors to thereby mute acoustic output. Those skilled in the art should recognize that other embodiments of the present invention can include a motor assembly without a flux shield.

As illustrated in detail in FIG. 11, FPC 402 includes a plurality of layers. FPC 402 includes a cover layer 430 that forms top surface 410 and includes a plurality of openings, such as openings 434, for exposing the pattern of conductor traces 442 (formed with interconnect layer 432) to staple-shaped stator conductors 415. Staple-shaped stator conductors 415 and the pattern of conductor traces (not shown in FIG. 11) form stator coil 414 that generates a magnetic field. Interconnect layer 432 is located adjacent cover layer 430 and includes the pattern of conductor traces, which form stator coils 414, and layers of traces for each phase of motor assembly 400. FPC 402 also includes a stiffener layer 438 adjacent interconnect layer 432 as discussed in the description related to FIG. 3.

Motor assembly 400 includes an adhesive layer 440 that allows flux shield 418, stator coils 414, stator teeth 412 and FPC 402 to be affixed to base 426. In such an embodiment, adhesive layer 440 such as a layer of PSA, also includes a liner that is formed adjacent stiffener layer 438 on bottom surface 441 of FPC 402. In use, the liner is pulled back and removed to expose the adhesive for attachment. However, motor assembly 400 can be affixed to base 426 in other manners. For example, adhesive layer 440 can be replaced with a separately applied adhesive or epoxy.

Therefore, FPC 402 is used as a positioning and attachment basis onto which stator assembly 404 can be installed into a data storage system quickly and inexpensively. As discussed with reference to FIG. 3, motor assembly 400 can also be radially aligned through fixturing and tacked or partially cured using the adhesives described above. After tacking, motor assembly 400 can be fully cured in an oven.

Figure 12:
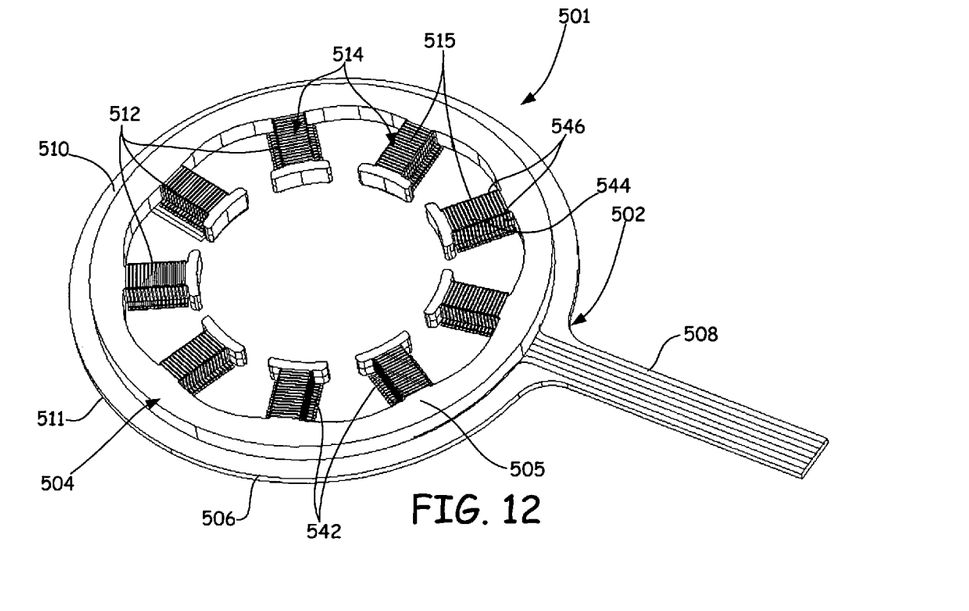
FIG. 12 illustrates a top perspective view of a motor subassembly in accordance with an embodiment of the present invention.

FIG. 12 illustrates a top perspective view of a motor subassembly 501 in accordance with an embodiment of the present invention. Motor subassembly 501 includes a FPC 502 and a stator assembly 504. FPC 502 has a top surface 510 and a bottom surface (hidden from view). FPC 502 includes an end portion 506 and a pathway portion 508. End portion 506 accommodates stator assembly 504. Pathway portion 508 provides a pathway for an interconnect layer, integrally formed with FPC 502, to electrically connect stator assembly 504 to a remotely located electrical connector for ultimate coupling to a PCB. End portion 506 includes a plurality of patterns of conductor traces 542. The patterns of conductor traces 542 are symmetrically and radially arranged on top surface 510 of end portion 506. Each pattern of conductor traces 542 are formed with the interconnect layer of FPC 502. Conductor traces were described in detail with respect to FIG. 6 and the interconnect layer will be discussed in detail with reference to FIG. 13. In comparison to FPC 402 of FIG. 8, FPC 502 includes a circular top surface area such that the end portion includes an outer diameter 511. Unlike FPC 402 of FIG. 8, FPC 502 does not include an inner opening.

Stator assembly 504 includes an annular stator yoke 505 coupled to a plurality of symmetrically and radially arranged stator teeth 512. Each stator tooth 512 of stator assembly 504 is configured to support a stator coil 514. Each stator tooth 512 includes a top portion 544 and side portions 546. Each stator tooth 512 is positioned adjacent and in alignment with each pattern of conductor traces 542. In one embodiment, end portion 506 of FPC 502 is affixed with an adhesive to stator assembly 504 at top surface 510. However, end portion 506 can be affixed to stator assembly 504 with other materials. For example, end portion 506 can be affixed to stator assembly 504 with solder, which is described in more detail below.

In the embodiment illustrated in FIG. 12, each stator coil 514 includes a set of staple-shaped stator conductors 515 and a corresponding pattern of the conductor traces 542. Each set of staple-shaped stator conductors 515 are deposited on top portion 544 of each stator tooth 512 such that each set of staple-shaped stator conductors are adjacent the top portion and side portions 546 of each stator tooth. Each set of stator conductors 515 has a shape similar to a shape of a conventional staple, which was clearly illustrated and described with respect to FIGS. 9 and 10.

As illustrated in the FIG. 12 embodiment, FPC 502 is affixed to stator assembly 504 with solder by way of staple-shaped conductors 515 being stacked on stator teeth 514 and soldered to conductor traces 542. In another embodiment, staple-shaped stator conductors 515 have prongs on their tips instead of feet as illustrated in FIG. 12. In such an embodiment, the prongs insert through openings in the top surface and the interconnect layer of FPC 502. The interconnect layer is configured to receive the prongs like a connector receiver. In yet another embodiment, a separate electrical connector can be soldered to the interconnect layer of FPC 502 such that it can connect the staple-shaped conductors 515 with conductor traces 542 of the interconnect layer. However, as previously discussed, FPC 502 can be affixed to stator assembly 504 with other materials, such as adhesive.

Figure 13:
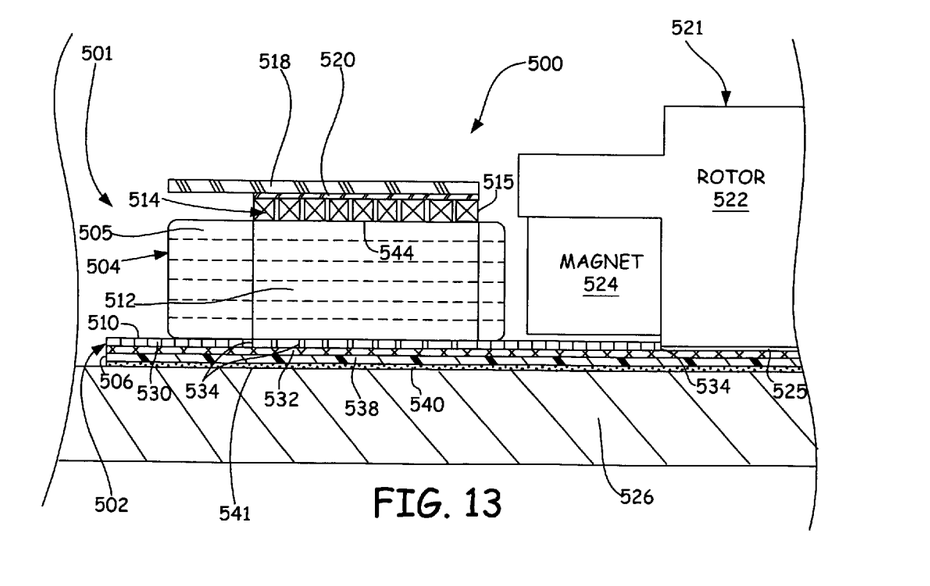
FIG. 13 illustrates a partial sectional view of a motor assembly including the motor subassembly illustrated in FIG. 12 in accordance with an embodiment of the present invention.

FIG. 13 illustrates a partial sectional view of a motor assembly 500 including the motor subassembly 501 illustrated in FIG. 12 in accordance with an embodiment of the present invention. Stator assembly 504 includes stator yoke 505, stator tooth 512 and stator coil 514. Stator coil 514 includes the pattern of conductor traces (not specifically illustrated in FIG. 13) included in interconnect layer 532 and a set of staple-shaped stator conductors 515. Stator assembly 504 is formed of a layered stack of magnetic steel laminations that are wound with wire. The layered stack of steel is coated with an insulative coating prior to winding. FIG. 13 also illustrates a base 526 in which FPC 502 is affixed to. In one embodiment of the present invention, base 526 is a basedeck of a data storage system. However, those skilled in the art should recognize that the present invention can be incorporated in other types of systems.

Motor assembly 500 also includes a simplified illustration of a rotor assembly 521. Rotor assembly 521 includes a rotor 522 and an annular magnet 524. Rotor assembly 521 is centrally located and mounted on FPC 502 such that stator assembly 504 is spaced apart and positioned around rotor assembly 521 on end portion 506.

Motor assembly 500 also includes a flux shield 518 and insulating layer 520. Flux shield 518 and insulating layer 520 are affixed to top portion 544 of stator tooth 512 with an adhesive. As discussed above, flux shield 518 and insulating layer 520 assist in insulating the discs or media in a data storage system from magnetic fields created by stator assembly 504 and magnet 524. Flux shield 518 and insulating layer 520 are adhered to stator assembly 504 which creates a "sandwich" potting of the stator coils to thereby mute acoustic output. Those skilled in the art should recognize that other embodiments of the present invention can include a motor assembly without a flux shield.

As illustrated in detail in FIG. 13, FPC 502 includes a plurality of layers. FPC 502 includes a cover layer 530 that forms top surface 510 and includes a plurality of openings 534 for exposing and allowing each pattern of conductor traces, which are formed with and connected to interconnect layer 532, to couple to each staple-shaped stator conductor 515. At least one of the openings 534 also exposes and allows interconnect layer 532 to couple to rotor 522. Besides interconnect layer 532 including layers of traces for each phase of the motor assembly, the interconnect layer also includes traces for rotor 522, the patterns of conductor traces and a ground trace for the rotor. In one embodiment, rotor assembly 521 is affixed to end portion 506 of FPC 502 with solder 525 such that rotor 522 is electrically coupled and electrically grounded to interconnect layer 532. However, those skilled in the art should recognize that other configurations are possible. For example, rotor 522 can be affixed to end portion 506 and electrically coupled to interconnect layer 532 with an electrically conductive adhesive.

Motor assembly 500 includes an adhesive layer 540 that allows flux shield 518, stator coils 514, stator teeth 512 and FPC 502 to be affixed to base 526. In such an embodiment, adhesive layer 540, such as a layer of PSA, also includes a liner and is formed adjacent stiffener layer 538 on a bottom surface 541 of FPC 502. In use, the liner is pulled back and removed to expose the adhesive for attachment. However, motor assembly 500 can be affixed to base 526 in other manners. For example, adhesive layer 540 can be replaced with a separately applied adhesive or epoxy.

Therefore, FPC 502 is used as a positioning and attachment basis onto which stator assembly 504 and rotor assembly 521 can be installed into a data storage system quickly and inexpensively. As discussed with reference to FIG. 3, motor assembly 500 is radially aligned through fixturing and tacked or partially cured using the adhesives described above. After tacking, motor assembly 500 can be fully cured in an oven.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the motor assembly while maintaining substantially the same functionality without departing from the scope and spirit of the present invention. In addition, although the preferred embodiment described herein is directed to a motor assembly for a data storage system, it will be appreciated by those skilled in the art that the teachings of the present invention can be applied to other types of systems, without departing from the scope and spirit of the present invention.

What is claimed is:

1. A motor assembly for mounting to a base, the motor assembly comprising:
    a stator assembly having a plurality of stator teeth supporting a plurality of stator coils, each stator coil including a set of staple-shaped stator conductors deposited on a medial portion of each stator tooth such that each of the set of stator conductors are adjacent the medial portion and side portions of each stator tooth; and
    a flexible printed circuit having opposing first and second surfaces and an end portion, the first surface of the end portion affixed to the stator assembly and the second surface affixed to the base;
    wherein the flexible printed circuit includes a plurality of conductor trace patterns, each pattern electrically coupling each staple-shaped conductor of a respective one of the stator coils.

2. The motor assembly of claim 1, wherein the second surface of the flexible printed circuit is affixed to the base with an adhesive.

3. The motor assembly of claim 2, wherein the adhesive is included as a layer of the flexible printed circuit.

4. The motor assembly of claim 1, wherein the end portion of the flexible printed circuit has an annular area that comprises an outer diameter and an inner diameter.

5. The motor assembly of claim 4, further comprising a rotor mounted on the base and inside the inner diameter of the flexible printed circuit.

6. The motor assembly of claim 1, wherein the end portion of the flexible printed circuit has a circular area that comprises an outer diameter.

7. The motor assembly of claim 6, further comprising a rotor centrally located and affixed to the first surface of the end portion such that the plurality of stator teeth of the stator assembly are positioned radially and symmetrically around the rotor.

8. The motor assembly of claim 7, wherein the rotor is electrically coupled to an interconnect layer of the flexible printed circuit and mechanically affixed to the end portion of the flexible printed circuit with an electrically conductive adhesive.

9. The motor assembly of claim 8, wherein the rotor is electrically coupled to an interconnect layer of the flexible printed circuit and affixed to the end portion on the flexible printed circuit with solder.

10. The motor assembly of claim 1 and further comprising a flux shield affixed to a medial portion of the stator assembly with an adhesive.

11. The motor assembly of claim 1, wherein the base comprises a basedeck of a data storage system.

12. A motor assembly for mounting to a basedeck of a data storage system, the motor assembly comprising:
    a flexible printed circuit including opposing first and second surfaces and a circular end portion having an outer diameter, the flexible printed circuit having an interconnect layer that extends continuously across the entire diameter of the end portion and a cover layer on the interconnect layer that includes a plurality of openings for exposing the interconnect layer, wherein the second surface of the flexible printed circuit is affixed to the basedeck of the data storage system;
    a stator assembly having a plurality of stator teeth each supporting a set of staple-shaped conductors, the stator assembly mechanically affixed to the first surface of the end portion and the staple-shaped conductors electrically attached to the continuous interconnect layer of the end portion through the openings in the cover layer; and
    a centrally located rotor mechanically affixed to the end portion and electrically attached to the continuous interconnect layer of the flexible printed circuit such that the plurality of stator teeth of the stator assembly are positioned radially and symmetrically around the rotor.

13. The motor assembly of claim 12, wherein the stator coils comprise a set of staple-shaped stator conductors deposited on a medial portion of each stator tooth such that each staple-shaped conductor includes a pair of side segments located adjacent side portions of the stator tooth and an intermediate segment that couples the pair of side segments and is located adjacent to the medial portion of each stator tooth, each staple-shape stator conductor in the set of staple-shaped stator conductors is spaced a distance from each other along the stator tooth.

14. A motor assembly comprising:
    a flexible printed circuit including an interconnect layer and a cover layer, the cover layer having a plurality of openings for exposing portions of the interconnect layer;
    a stator assembly affixed to the flexible printed circuit and having a stator yoke and a plurality of stator teeth that extend from the stator yoke, each stator tooth having a medial portion and side portions; and a set of staple-shaped stator conductors deposited on the medial portion of each stator tooth such that each staple-shaped conductor includes a pair of side segments located adjacent the side portions of the stator tooth and an intermediate segment that couples the pair of side segments and is located adjacent to the medial portion of the stator tooth, wherein each set of staple-shaped conductors is electrically coupled to the interconnect layer of the flexible printed circuit through the plurality of openings to form stator coils.

15. The motor assembly of claim 14, wherein the set of staple-shaped conductors deposited on the medial portion of each stator tooth is electrically coupled to the interconnect layer through the openings in the cover layer of the flexible printed circuit with solder.

16. The motor assembly of claim 14, wherein each staple-shaped conductor of the set of staple-shaped conductors is spaced a distance from each other along the stator tooth.

17. The motor assembly of claim 14, wherein each side segment of the staple-shaped conductors includes a straight distal prong to be inserted through the openings in the cover layer of the flexible printed circuit for connection to the interconnect layer.

18. The motor assembly of claim 14, wherein each side segment of the staple-shaped conductors includes a distal foot that is oriented substantially perpendicular to the side segment for providing a larger surface area for connection to the interconnect layer.

19. A motor comprising:

a stator defining a plurality of stator teeth;

a plurality of electrically conductive members trained around each of the stator teeth, each of the plurality of electrically conductive members individually circumscribing each stator tooth less than one complete revolution; and a flexible printed circuit having an interconnect layer and a cover layer, the cover layer including a plurality of openings for exposing the interconnect layer, wherein each of the plurality of electrically conductive members in combination with the interconnect layer form a coil wound around each stator tooth.

20. The motor of claim 19, wherein the flexible printed circuit having opposing first and second surfaces and an end portion, the first surface of the end portion being affixed to the stator and the second surface of the end portion being affixed to a base of which the motor is to be mounted.

21. The motor of claim 19, wherein each stator tooth comprises a medial portion and a pair of side portions, each electrically conductive member being adjacent the medial portion and the side portions.

22. The motor of claim 21, wherein each electrically conductive member includes an intermediate segment adjacent the medial portion of each stator tooth and a pair of side segments adjacent each of the respective pair of side portions of each stator tooth.

* * * * *